(12) United States Patent
Wang (10) Patent No.: US 8,390,009 B2
(45) Date of Patent: Mar. 5, 2013

(54) LIGHT-EMITTING DIODE (LED) PACKAGE SYSTEMS

(75) Inventor: Chung Yu Wang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 344 days.

(21) Appl. No.: 12/706,040

(22) Filed: Feb. 16, 2010

(65) Prior Publication Data

US 2011/0198638 A1 Aug. 18, 2011

(51) Int. Cl.
*H01L 33/00* (2010.01)

(52) U.S. Cl. .......... 257/98; 257/79; 257/81; 257/88; 257/99; 438/22; 438/26; 438/82; 438/98; 438/106

(58) Field of Classification Search .................. None
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,531,328 B1 * | 3/2003 | Chen .................. 438/26 |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,730,533 B2 * | 5/2004 | Durocher et al. ........... 438/26 |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 2003/0189829 A1 * | 10/2003 | Shimizu et al. .............. 362/240 |
| 2006/0163596 A1 * | 7/2006 | Kim et al. .................... 257/98 |
| 2007/0145404 A1 * | 6/2007 | Murayama et al. ........... 257/99 |
| 2008/0054486 A1 * | 3/2008 | Murayama et al. .......... 257/774 |

* cited by examiner

*Primary Examiner* — Kyoung Lee
(74) *Attorney, Agent, or Firm* — Haynes and Boone, LLP (57) ABSTRACT

A package system includes a substrate having at least one first thermally conductive structure through the substrate. At least one second thermally conductive structure is disposed over the at least one first thermally conductive structure. At least one light-emitting diode (LED) is disposed over the at least one second thermally conductive structure.

19 Claims, 11 Drawing Sheets

LIGHT-EMITTING DIODE (LED) PACKAGE SYSTEMS

TECHNICAL FIELD

The present disclosure relates generally to the field of semiconductor package systems, and more particularly, to light-emitting diode (LED) package systems.

BACKGROUND OF THE DISCLOSURE

Light-emitting diodes (LEDs) are semiconductor light sources and have been used to replace conventional fluorescent lamp sources. Conventionally, LEDs are semiconductor diodes made from compound materials. If the diodes are forward biased, electrons supplied from a node recombine with holes supplied from another node, releasing energy in the form of photons. By selecting the compound materials, emission colors of the LEDs can vary from red to blue.

BRIEF DESCRIPTION OF THE DRAWINGS

The present disclosure is understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION OF THE DISCLOSURE

An LED is formed on a sapphire substrate. For packaging, the LED is then mounted on a lead frame. Gold wires are bonded between the lead frame and electrodes of the LED for supplying voltages for light emission. A dome silicone lens is disposed on the LED such that light generated from the LED can pass through the dome silicone lens and be refracted by the dome silicone.

As noted, the operation of the LED generates heat. The sapphire substrate is made from aluminum oxide and has an undesired thermal conductivity. The gold wires become the main conduits for releasing heat generated from the operation of the LED. If the LED operates at a low power, the gold wires may release heat generated therefrom. However, if the LED generates greater quantities of heat at a greater intensity, the gold wires cannot desirably release the heat. If the heat is not dissipated and accumulates, the LED can be damaged causing a shortened lifespan or terminal failure.

It is also found that the gold wires are extended over the LED. The gold wires may block a portion of light emitted from the LED. The emission efficiency of the LED may be adversely affected.

Based on the foregoing, LED package systems are desired.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Embodiments of this disclosure are related to a package system including a light-emitting diode (LED). The exemplary package system can include a substrate having at least one first thermally conductive structure through the substrate. At least one second thermally conductive structure can be disposed over the at least one first thermally conductive structure. At least one light-emitting diode (LED) can be disposed over the at least one second thermally conductive structure. While the LED emits light, the heat generated from the LED operation can be desirably released through the at least one thermally conductive structure and the at least one second thermally conductive structure to a heat sink. Since the package system can desirably release the heat generated from the LED operation, the LED can function at a high-power operation. Following are descriptions regarding exemplary package systems and manufacturing methods thereof. The scope of the disclosure is not limited thereto.

Figure 1:
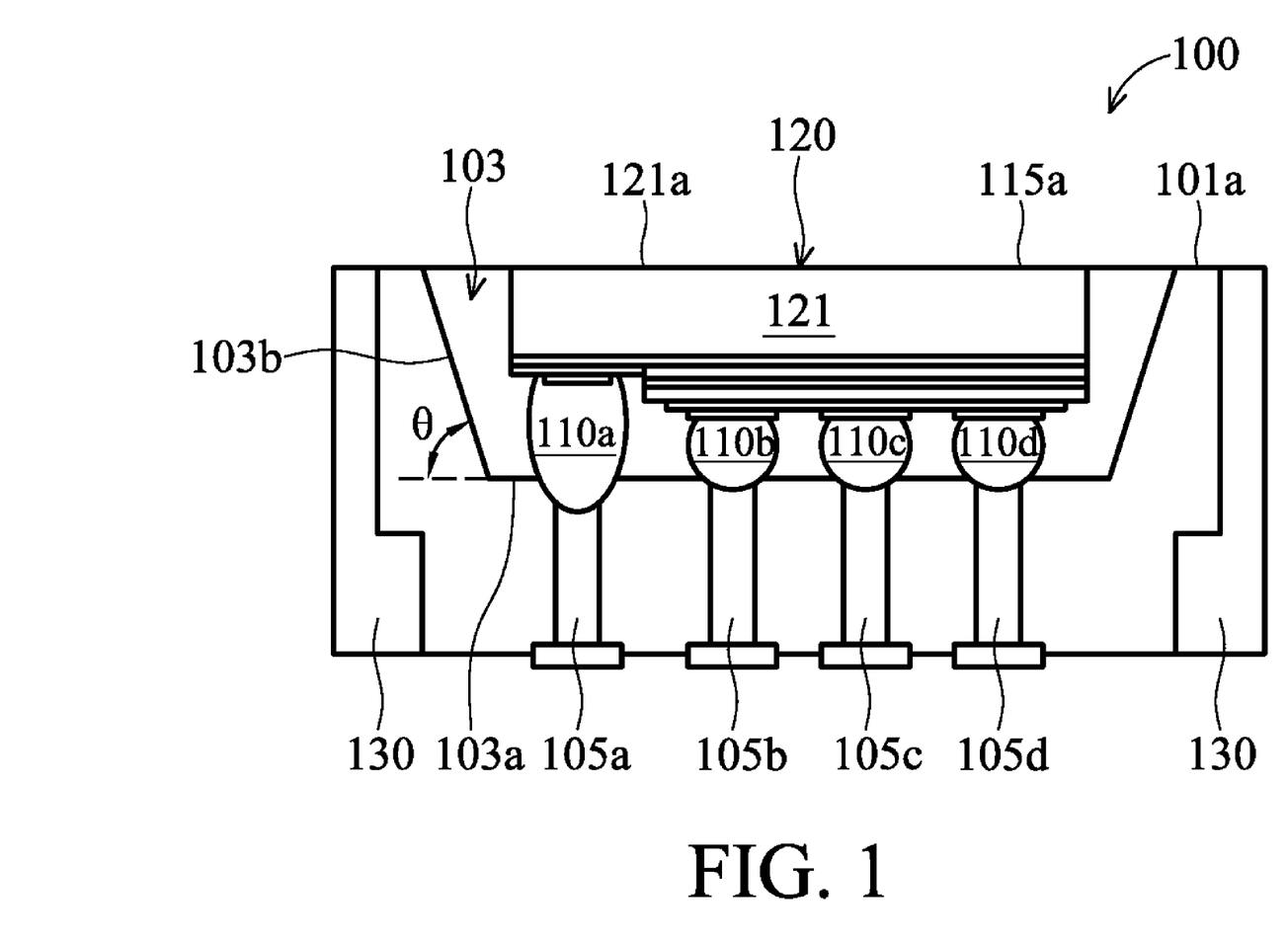
FIG. 1 is a schematic cross-sectional view illustrating an exemplary package system including an LED.

FIG. 1 is a schematic cross-sectional view illustrating an exemplary package system including an LED. In FIG. 1, a package system 100 can include a substrate 101 electrically and/or thermally coupled with an LED 120 through at least one thermally conductive structure, e.g., thermally conductive structures 110a-110d. In embodiments, the substrate 101 may include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

In some embodiments, the substrate 101 can include at least one thermally conductive structure, e.g., thermally conductive structures 105a-105d, through the substrate 101. The thermally conductive structures 105a-105d can have via structures, contact structures, single-damascene structures, dual-damascene structures, pillar structures, line structures, bulk structures, other suitable structures, or any combinations thereof. In some embodiments, the thermally conductive structures 105a-105d can be referred to as through-silicon-vias (TSVs). In some embodiments, the thermally conductive structures 105a-105d can include, for example, a barrier material (e.g., titanium, titanium-nitride, tantalum, tantalum-nitride, other barrier material, and/or combinations thereof), conductive material (aluminum, copper, aluminum-copper, polysilicon, other conductive material, and/or combinations thereof), other material that is suitable for forming the thermally conductive structures 105a-105d, and/or combinations thereof.

Referring to FIG. 1, in some embodiments, the package system 100 can include the thermally conductive structures 110a-110d, disposed over the thermally conductive structures 105a-105d, respectively. The thermally conductive structures 110a-110d can have, for example, ball structures, oval structures, bulk structures, line structures, pillar structures, other suitable structures, or any combinations thereof. In some embodiments, the thermally conductive structures 110a-110d can be referred to as bump structures. In embodiments, the thermally conductive structures 110a-110d can include a material such as a lead-free alloy (such as gold (Au) or a tin/silver/copper (Sn/Ag/Cu) alloy), a lead-containing alloy (such as a lead/tin (Pb/Sn) alloy), copper, aluminum, aluminum copper, conductive polymer, other bump metal material, and/or combinations thereof.

Referring to FIG. 1, the package system 100 can include at least one LED, e.g., LED 120, disposed over the thermally conductive structure 110a-110d. In embodiments, the LED 120 can include a transparent substrate 121 and various semiconductor material layers (not labeled). The transparent substrate 121 can be, for example, a sapphire substrate, a glass substrate, an aluminum oxide substrate, or other transparent substrate. The light emitted from the LED 120 can pass through the transparent substrate 121.

In some embodiments, the semiconductor material layers can include at least one N-type semiconductor material layer and at least one P-type semiconductor material. Depending on the emission color, the semiconductor material layers can include at least one material such as gallium arsenide (GaAs), aluminum gallium arsenide (AlGaAs), gallium arsenide phosphide (GaAsP), aluminum gallium indium phosphide (AlGaInP), gallium phosphide (GaP), gallium arsenide phosphide (GaAsP), aluminum gallium indium phosphide (AlGaInP), indium gallium nitride (InGaN), gallium nitride (GaN), aluminum gallium phosphide (AlGaP), zinc selenide (ZnSe), silicon carbide (SiC), silicon, carbon, boron nitride (BN), aluminum nitride (AlN), aluminum gallium nitride (AlGaN), aluminum gallium indium nitride (AlGaInN), other semiconductor material, or any combinations thereof.

In some embodiments, the LED 120 can optionally include at least one multiple-quantum-wells layer, a single-quantum-well layer, and/or a quantum-dots layer disposed between the N-type semiconductor material layer and the P-type semiconductor material. The quantum-wells or quantum-dots layer can be the layer where electrons and holes provided from the N-type semiconductor material layer and the P-type semiconductor material, respectively, recombine.

In some embodiments, at least one pad (not labeled) can be disposed between the thermally conductive structures 105a-105d and 110a-110d. The at least one pad may comprise at least one material such as copper (Cu), aluminum (Al), aluminum copper (AlCu), aluminum silicon copper (AlSiCu), or other conductive material or various combinations thereof. In embodiments, the at least one pad may include an under bump metallization (UBM) layer.

Referring again to FIG. 1, in some embodiments the thermally conductive structures 105a and 110a can be electrically coupled with an electrode of the LED 120. At least one of the thermally conductive structures 105b-105d and 110b-110d, respectively, can be electrically coupled with another electrode of the LED 120. By applying voltages to the electrodes, the LED 120 can emit a light with a desired color.

As noted, the LED 120 can be thermally coupled with the thermally conductive structures 105a-105d through the thermally conductive structures 110a-110d, respectively. Heat generated from the operation of the LED 120 can be desirably released through the thermally conductive structures 105b-105d and 110b-110d to a heat sink and/or another substrate (not shown), e.g., a printed circuit board (PCB). By releasing the heat, the LED 120 can desirably function at a high-power operation. The LED 120 can be substantially protected from being damaged by accumulated heat.

Referring again to FIG. 1, the substrate 101 can have a cavity 103 for accommodating the LED 120. The cavity 103 can have a flat surface 103a and at least one beveled surface, e.g., a beveled surface 103b. The beveled surface 103b can serve as a reflective surface that is capable of reflecting the light emitted from the LED 120. Light reflected from the beveled surface 103b may contribute to the emission efficiency of the LED 120. In embodiments, the flat surface 103(a) and the beveled surface 103b can have an angle $\theta$ between about 50° and about 60°. It is noted that the number of the LED disposed in the cavity 103 described above in conjunction with FIG. 1 is merely exemplary. In other embodiments, two or more LEDs can be disposed in the cavity 103.

In some embodiments, the package system 100 can include a lens material 115 disposed between the substrate 101 and the LED 120. The lens material 115 can include, for example, silicone, polymer, other lens material, or any combinations thereof. In embodiments, the lens material 115 can optionally include color phosphor for adjusting the emission color of the package system 100.

Referring again to FIG. 1, a surface 121a of the transparent substrate 121 and a surface 115a of the lens material 115 can be substantially level with a surface 101a of the substrate 101. In other embodiments, a dome lens or dome encapsulant (not shown) can be disposed over the transparent substrate 121, covering the LED 120. The dome lens may help to refract the light emitted from the LED 120 through the transparent substrate 121.

In some embodiments, the package system 100 can include a polymer material 130. The polymer material 130 can be disposed around the substrate 101 and extend from the surface 101a of the substrate 101 to another surface 101b of the substrate 101. The polymer material 130 can serve as a protection wall and/or a stress buffer for the substrate 101 and the LED 120.

Figure 2:
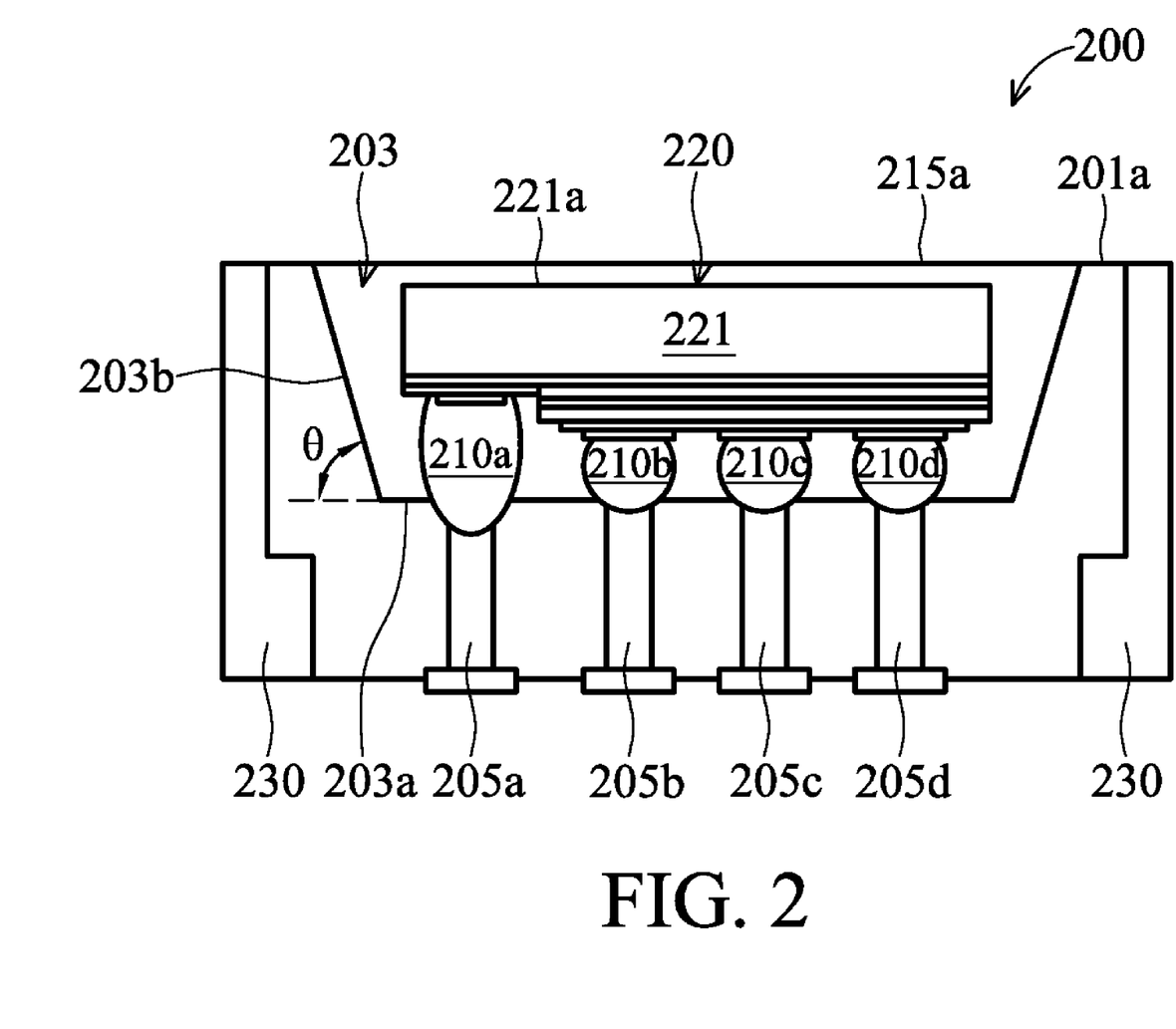
FIG. 2 is a schematic cross-sectional view illustrating another exemplary package system including an LED.

FIG. 2 is a schematic cross-sectional view illustrating another exemplary package system including an LED. Items of FIG. 2 that are the same items in FIG. 1 are indicated by the same reference numerals, increased by 100. In FIG. 2, a lens material 215 can be disposed between a substrate 201 and an LED 220 and surround the LED 220. In some embodiments, the lens material 215 may include color phosphor for adjusting the emission color from the LED 220. A surface 215a of the lens material 215 can be over a surface 221a of a transparent substrate 221. The surface 215a can be substantially level with a surface 201a of the substrate 201. In other embodiments, a dome lens or dome encapsulant (not shown) can be disposed over the transparent substrate 221, covering the LED 220. The dome lens may help to refract the light emitted from the LED 220 through the transparent substrate 221.

Figure 3A:
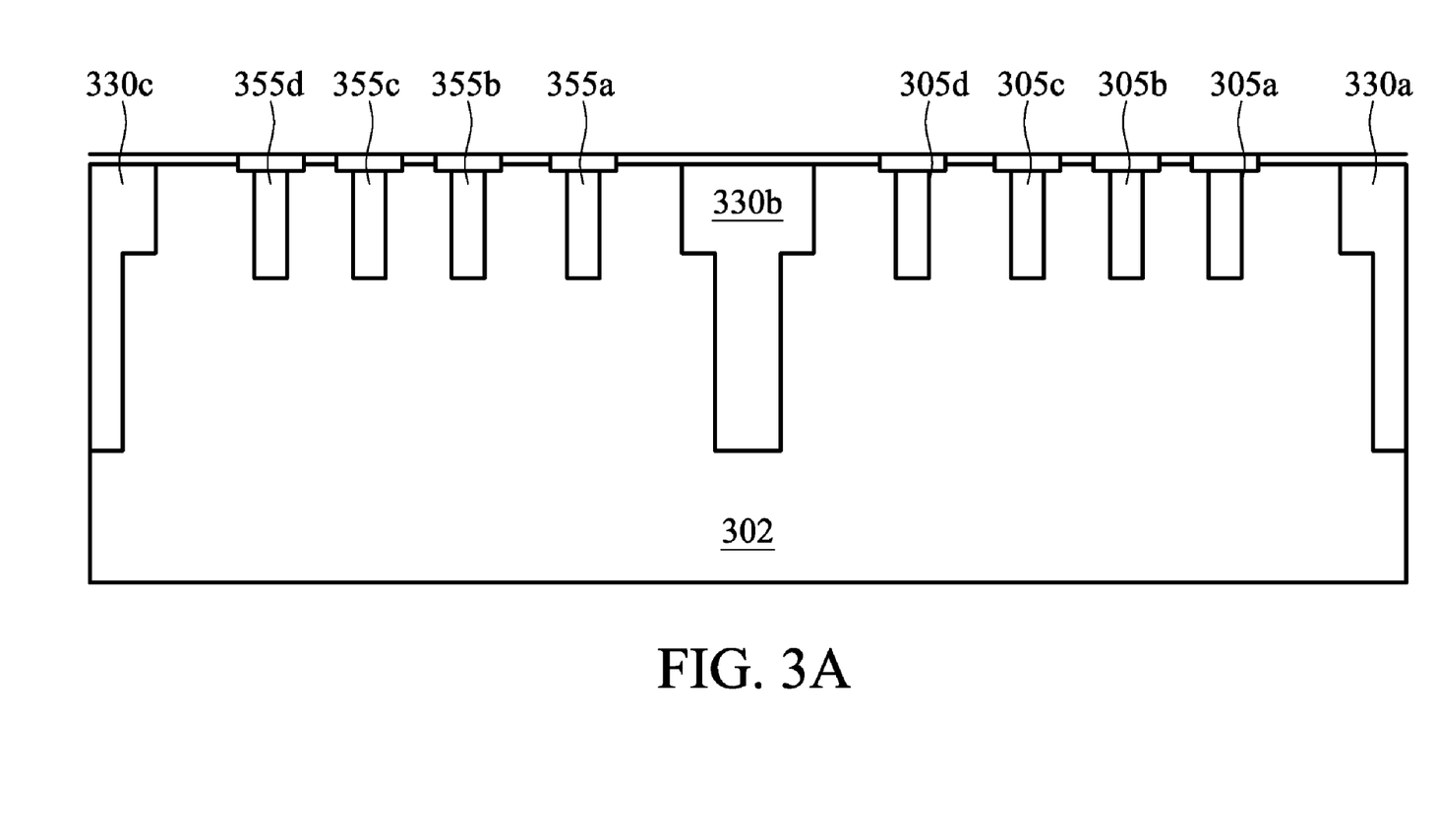
FIGS. 3A-3H are schematic cross-sectional views illustrating an exemplary method for forming a plurality of LED package systems.

FIGS. 3A-3H are schematic cross-sectional views illustrating an exemplary method for forming a plurality of package systems. Items of FIGS. 3A-3H that are the same items in FIG. 1 are indicated by the same reference numerals, increased by 200 or 250. In FIG. 3A, polymer materials 330a-330c can be formed in a substrate 302. The polymer materials 330a-330c can be formed along scribe lines defined on the substrate 302. The polymer materials 330a-330c can be formed by, for example, a single or multiple blade sawing processes or laser sawing processes for forming T-shape trenches in the substrate 302. In some embodiments, the polymer materials 330a-330c can be printed and/or dispensed in the T-shape trenches. The polymer materials 330a-330c can be then subjected to a curing process for hardening the polymer materials 330a-330c.

Referring again to FIG. 3A, at least one thermally conductive structure, e.g., thermally conductive structures 305a-305d and 355a-355d, can be formed in the substrate 302. The thermally conductive structures 305a-305d and 355a-355d can have a length smaller than that of the polymer materials 330a-330c. The thermally conductive structures 305a-305d can be spaced from the thermally conductive structures 355a-355d by the polymer material 330b. The thermally conductive structures 305a-305d and 355a-355d can be formed by, for example, photolithographic and etch processes for forming openings in the substrate 302. Conductive materials can be formed in the openings by a CVD, PVD, ALD, electroplating method, and/or other process to fill the openings. A chemical mechanical polish (CMP) process can polish the conductive materials over the substrate 302, forming the thermally conductive structures 305a-305d and 355a-355d in the opening.

Figure 3B:
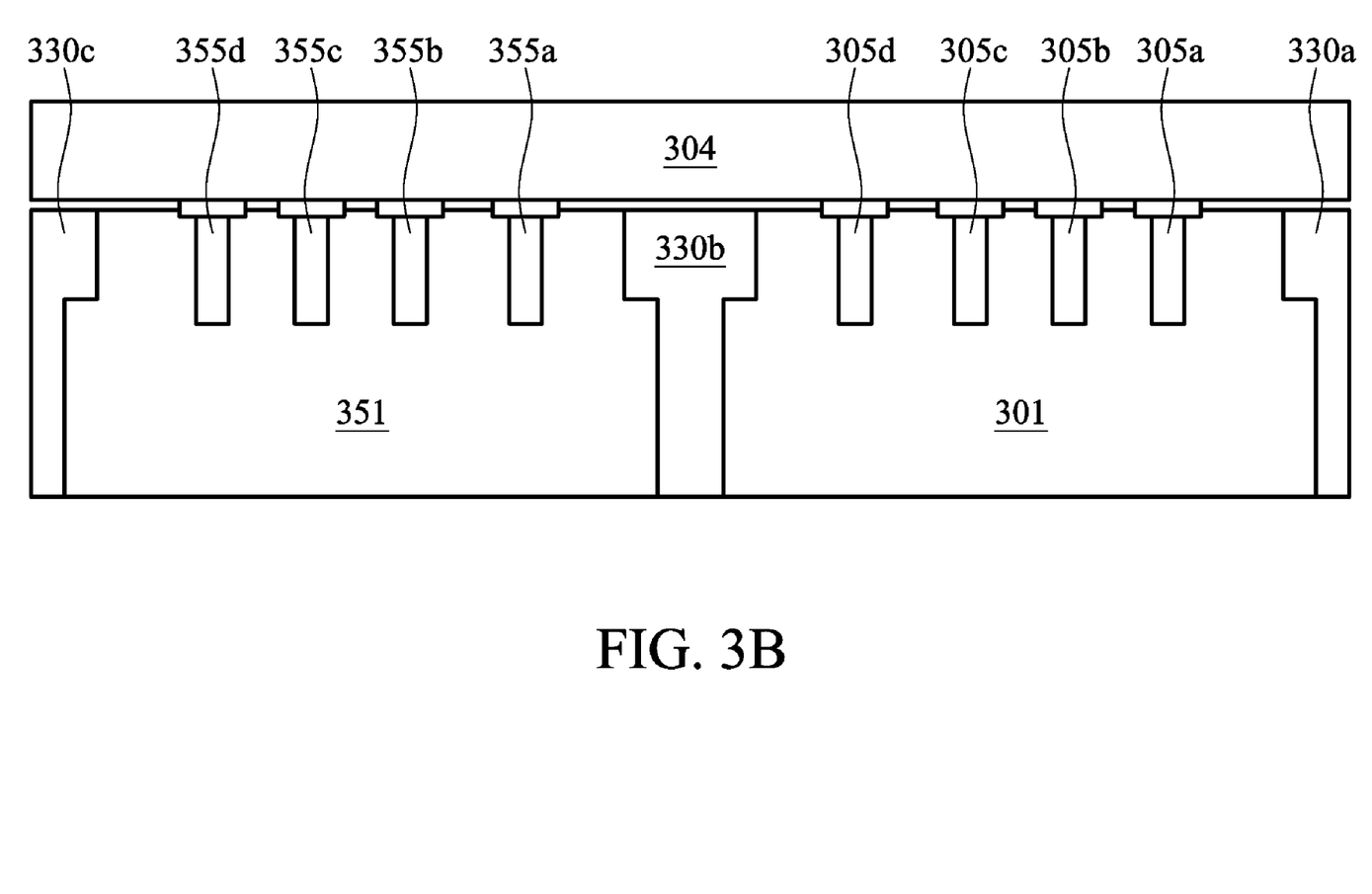

In FIG. 3B, a carrier 304, e.g., a glass carrier, can be disposed over the substrate 302. The carrier 304 can be attached to the substrate 302 through an adhesive tape (not shown). The carrier 304 can carry the substrate 302 for removing, e.g., polishing, a portion of the substrate 302 (shown in FIG. 3A), forming substrates 301 and 351. The removing process can expose the polymer materials 330a-330c. In some embodiments, the polymer material 330b can isolate the substrate 301 from the substrate 351.

Figure 3C:
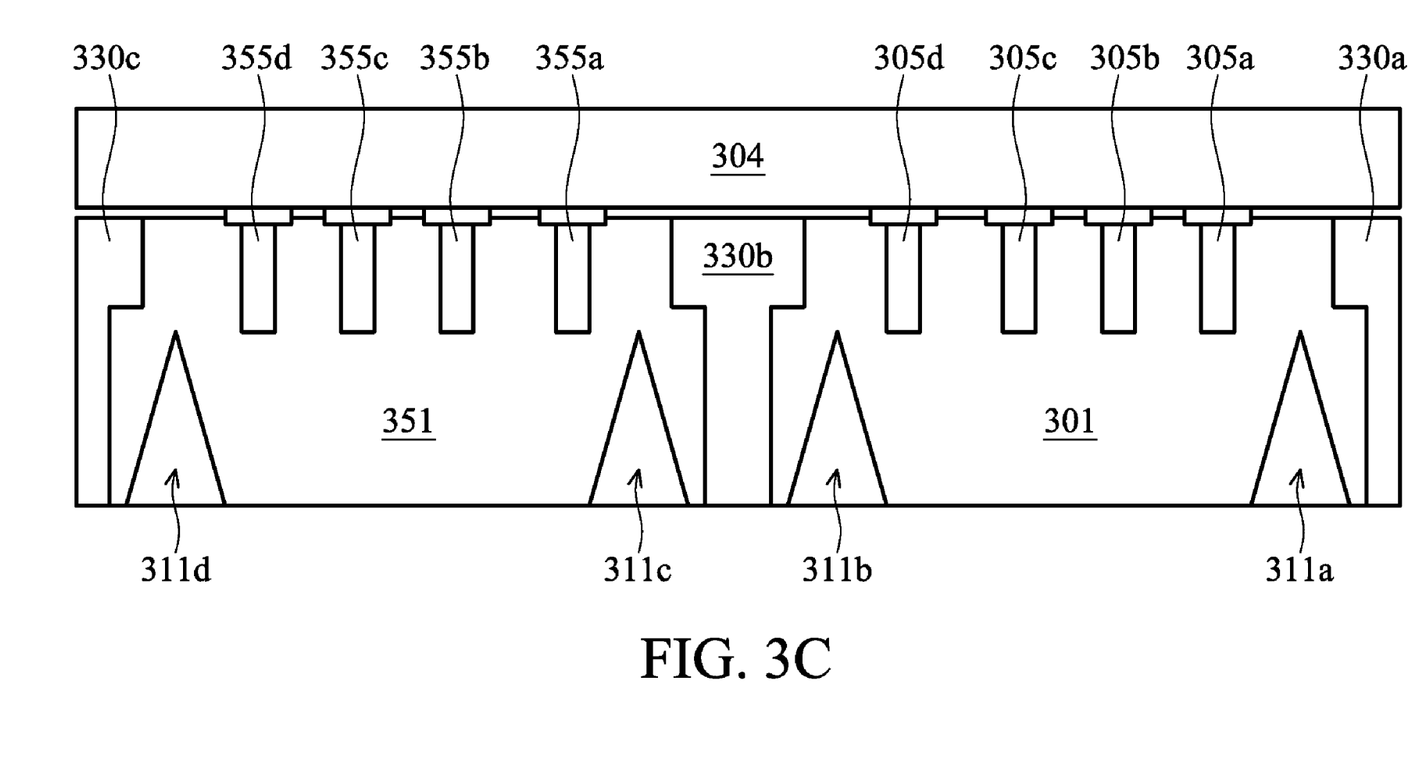

Referring to FIG. 3C, a plurality of grooves 311a-311b and 311c-331d can be formed in the substrates 301 and 351, respectively. The grooves 311a-311d can be formed adjacent to the polymer materials 330a-330c. Each of the grooves 311a-311d can have beveled surfaces. In some embodiments, the grooves 311a-311d can be formed by a bevel sawing process. In other embodiments, tips of the grooves 311a-311d can be at the level substantially equal to the bottom surfaces of the thermally conductive structures 305a-305d and 355a-355d as shown in FIG. 3C.

Figure 3D:
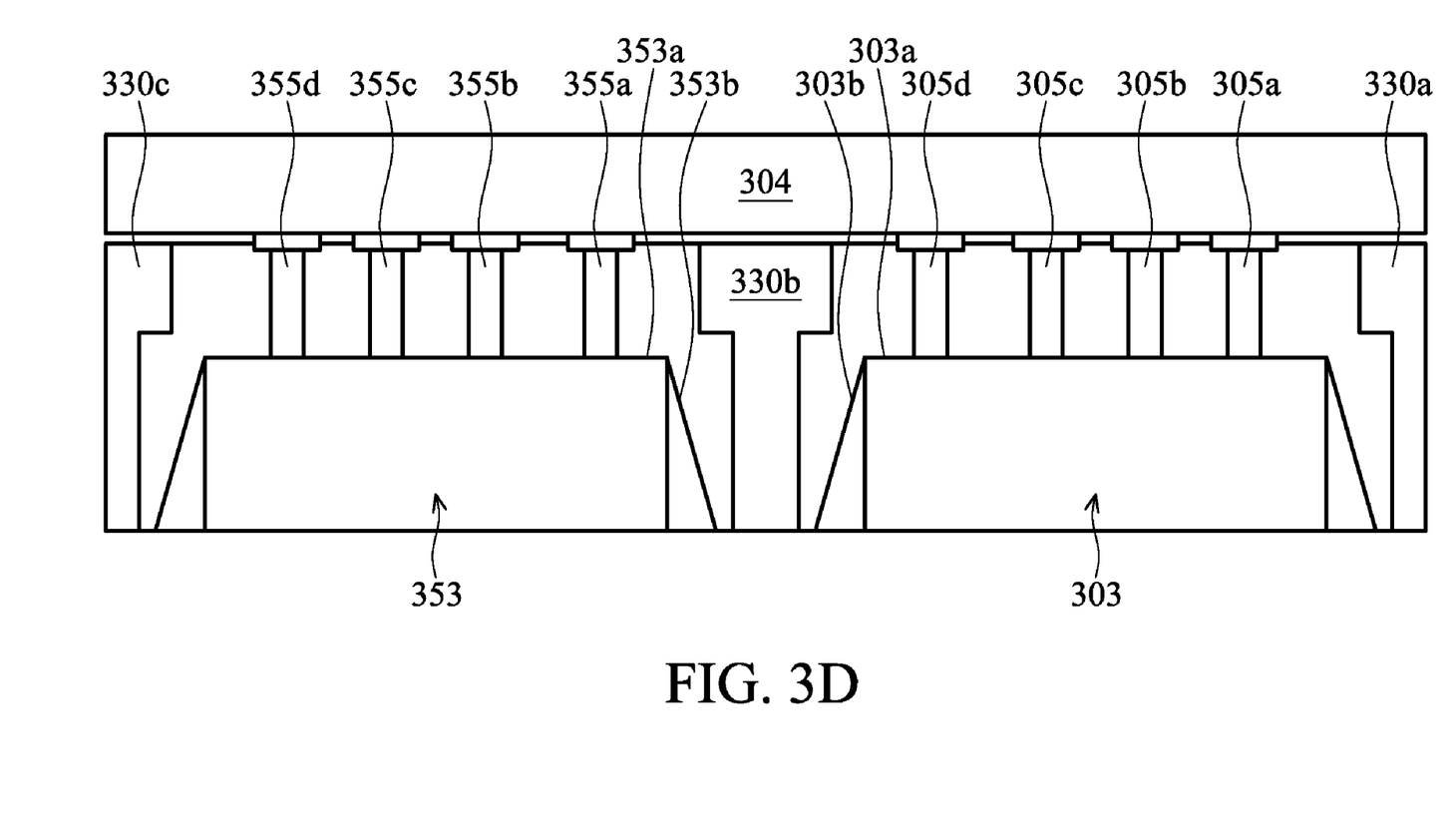

As shown in FIG. 3D, portions of the substrates 301 and 351 (shown in FIG. 3C) can be removed for forming cavities 303 and 353 in the substrates 301 and 351, respectively. Removing the portions of the substrates 301 and 351 can expose the thermally conductive structures 305a-305d and 355a-355d. The cavities 303 and 353 can have flat surfaces 303a and 353a and beveled surfaces 303b and 353b, respectively. The beveled surfaces 303b and 353b can serve as reflective surfaces for LEDs. In embodiments, removing the portions of the substrates 301 and 351 can include a photolithographic process forming a patterned photoresist (not shown) exposing regions that are to be removed. An etch process, e.g., a reactive ion etch (RIE) process, can remove the exposed regions. After forming the cavities 303 and 353, the patterned photoresist can be removed.

In some embodiments, the thermally conductive structures 305a-305d and 355a-355d can be optionally subjected to an electroless nickel immersion gold (ENIG) process or an immersion tin (Im—Sn) process for forming ENIG or Im—Sn material on the exposed surfaces of the thermally conductive structures 305a-305d and 355a-355d. The ENIG or Im—Sn material can serve as a bonding interface between the thermally conductive structures 305a-305d and 355a-355d and 310a-310d and 360a-360d (shown in FIG. 3E).

Figure 3E:
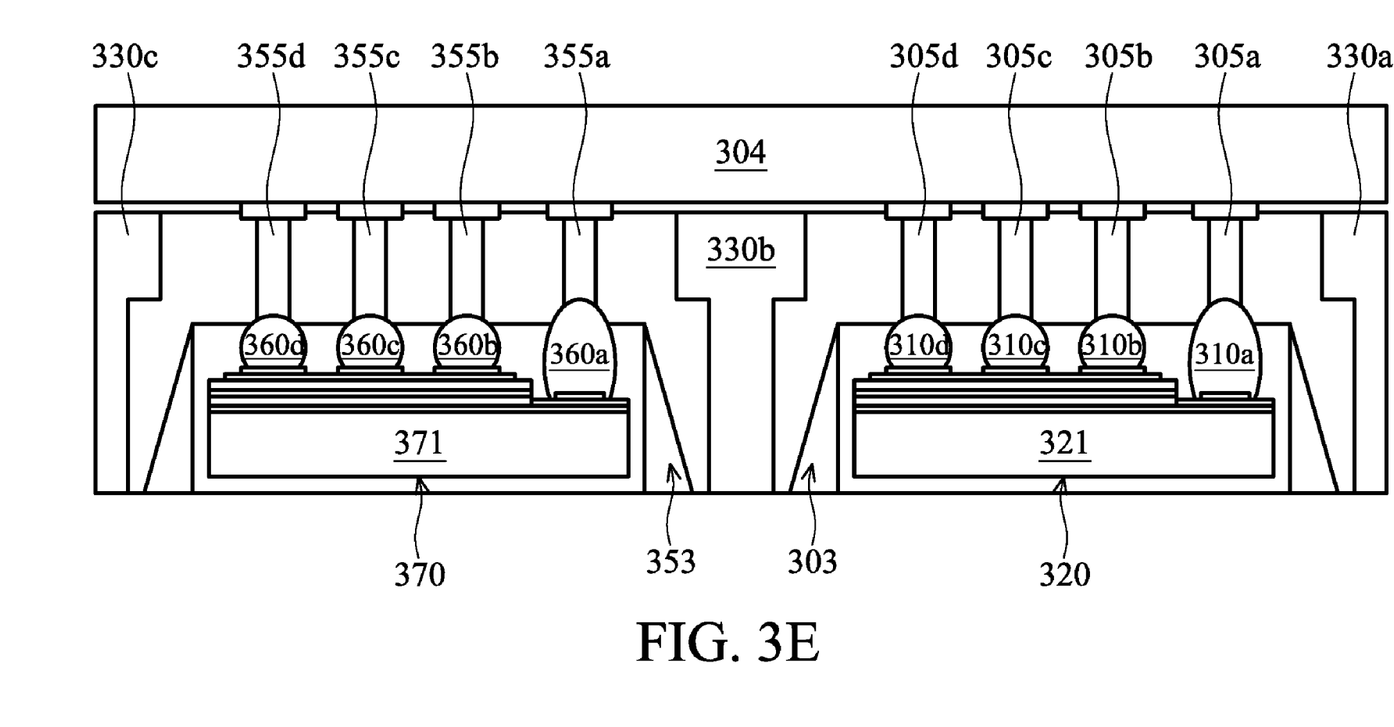

As shown in FIG. 3E, LEDs 320 and 370 can be disposed in the cavities 303 and 353, respectively. The LEDs 320 and 370 can be formed by any known LED fabricating method. The LEDs 320 and 370 including thermally conductive structures 310a-310d and 360a-360d can be bonded with the thermally conductive structures 305a-305d and 355a-355d, respectively. The LEDs 320 and 370 can be thermally and/or electrically coupled with the thermally conductive structures 305a-305d and 355a-355d through the thermally conductive structures 310a-310d and 360a-360d, respectively.

Figure 3F:
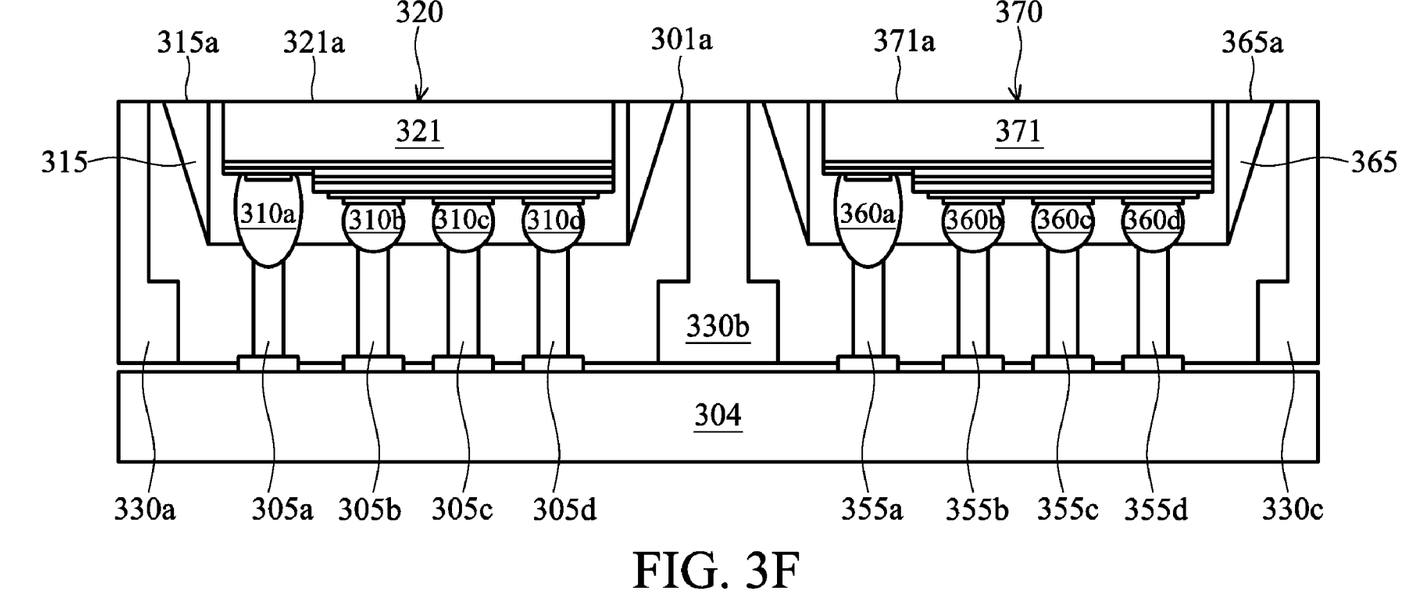

As shown in FIG. 3F, lens materials 315 and 365 can be formed between the substrate 301 and the LED 320 and between the substrate 351 and the LED 370, respectively. For example, after flipping the structure shown in FIG. 3E, the lens materials 315 and 365 can be formed by printing or dispensing a lens material filling in the cavities 303 and 353 (shown in FIG. 3E). A polish process and/or a plasma etch process can be performed, removing the lens material over the transparent substrates 321 and 371. In this embodiment, the surface 315a of the lens material 315 can be substantially level with the surface 321a of the transparent substrate 321. In other embodiments, a dome lens or dome encapsulant (not shown) can be formed over the transparent substrate 321.

In other embodiments, the surface 315a of the lens material 315 can be formed over the surface 321a of the transparent substrate 321 that is similar to the structure shown in FIG. 2. In this embodiment, the cavity 303 of the substrate 301 (shown in FIG. 3E) can be further deepened. After the LED 320 is disposed in the cavity 303, the surface 321a of the transparent substrate is lower than the surface 301a of the substrate 301. The lens material 315 can be formed over the transparent substrate 321 and surround the LED 320. The surface 315a of the lens material 315 can be substantially level with the surface 301a of the substrate 301.

Figure 3G:
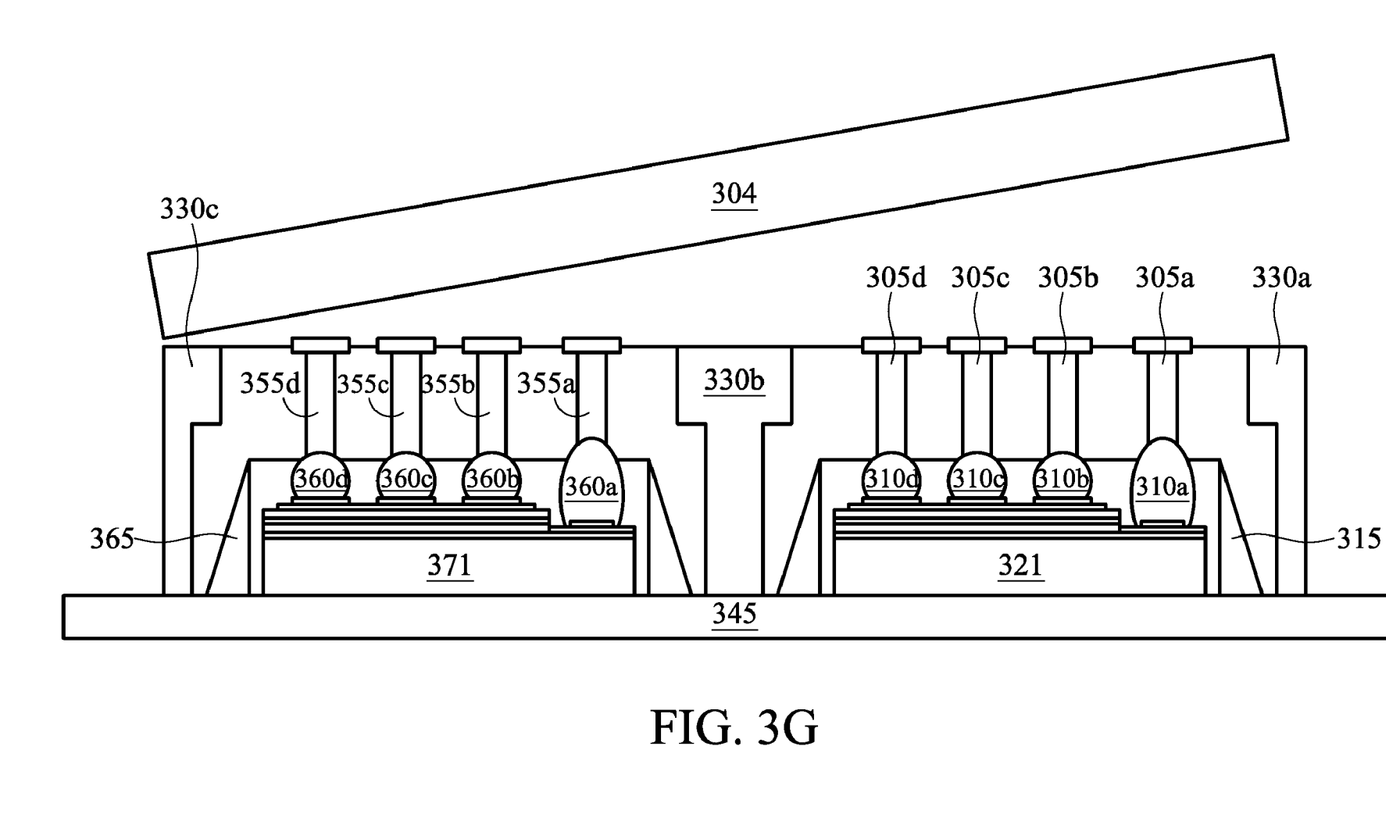

Referring to FIG. 3G, the structure shown in FIG. 3F can be flipped and mounted on a dicing tap 345. In some embodiments, the carrier 304 can be removed from the substrates 301 and 351.

Figure 3H:
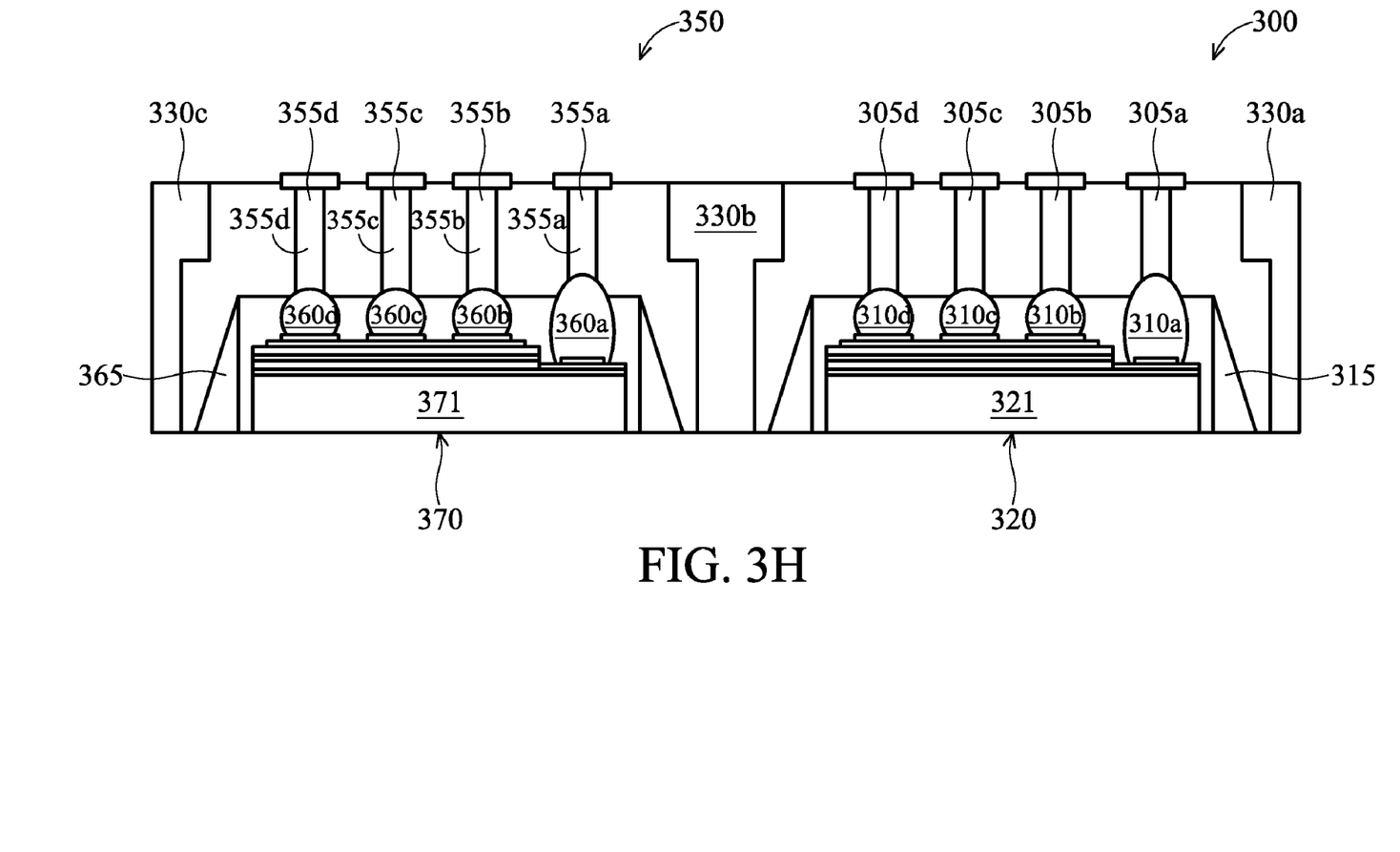

Referring to FIG. 3H, the structure shown in FIG. 3G is subjected to a dicing process for separating the package system 300 from the package system 350. In some embodiments, the dicing process can include a blade sawing process and/or a laser sawing process. In other embodiments, the dicing process can be performed along the polymer materials 330a, 330b, and 330c. As noted, the polymer materials 330a, 330b, and 330c are disposed around the substrates 301 and 351. The polymer materials 330a, 330b, and 330c can provide a desired mechanical support for singulation of the package systems 300 and 350.

It is noted that the number of the package systems 300 and 350 formed by the processes described above in conjunction with FIGS. 3A-3H are merely exemplary. More package systems including LEDs can be formed. Since multiple package systems can be formed on the same base substrate 302 (shown in FIG. 3A), the processes described above in conjunction with FIGS. 3A-3H can be referred to as a wafer-level process.

Figure 4:
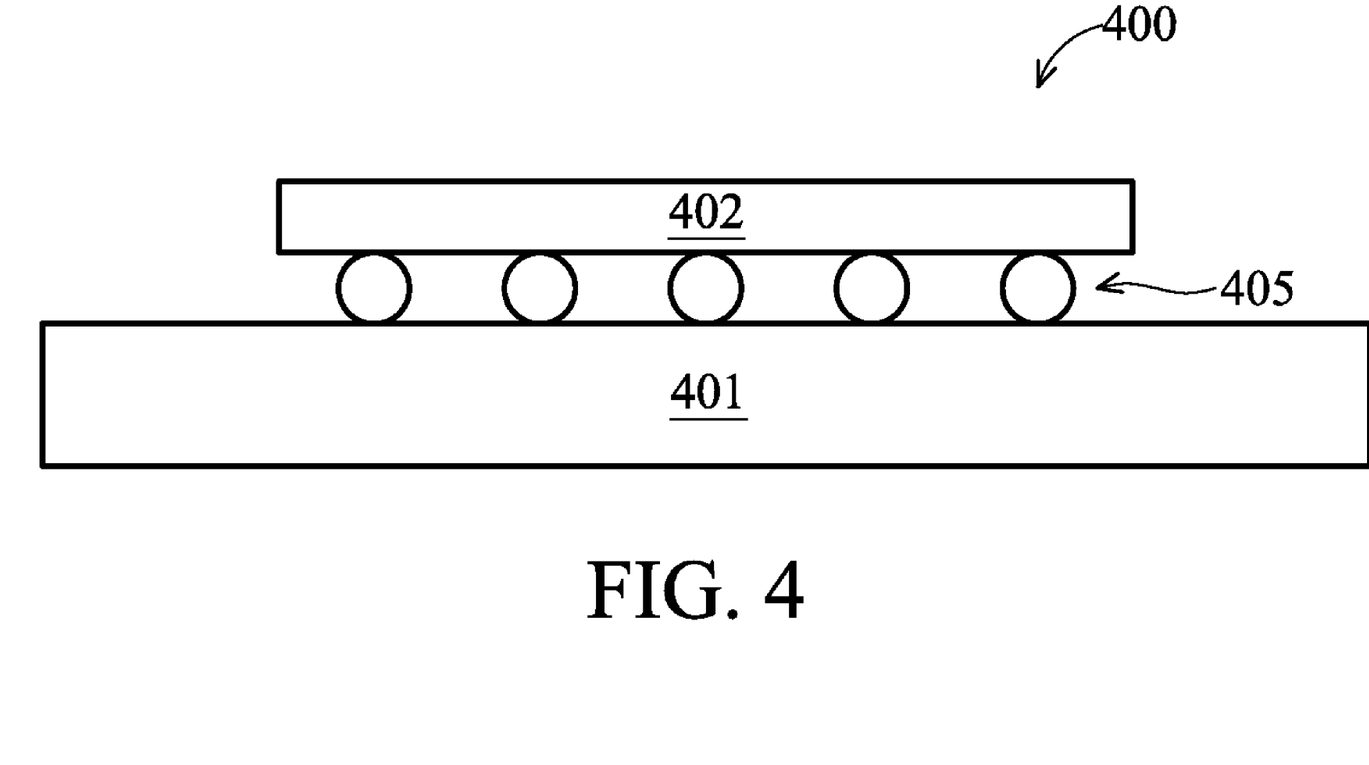
FIG. 4 is a schematic drawing illustrating a system including an exemplary LED package system disposed over a substrate board.

FIG. 4 is a schematic drawing illustrating a system including an exemplary LED package system disposed over a substrate board. In FIG. 4, a system 400 can include a package system 402 disposed over a substrate board 401. The substrate board 401 can include a printed circuit board (PCB), a printed wiring board and/or other carrier that is capable of carrying an integrated circuit. In some embodiments, the package system 402 can be similar to the package system 100 or 200 described above in conjunction with FIGS. 1 and 2. The package system 402 can be electrically coupled with the substrate board 401. In some embodiments, the package system 402 can be electrically and/or thermally coupled with the substrate board 401 through bumps 405. The system 400 can be part of an electronic system such as displays, panels, lighting systems, auto vehicles, entertainment devices, or the like. In some embodiments, the system 400 including the package system 402 can provides an entire system in one IC, so-called system on a chip (SOC) or system on integrated circuit (SOIC) devices.

From the foregoing, an exemplary embodiment of this application provides a package system. The package system includes a substrate having at least one first thermally conductive structure through the substrate. At least one second thermally conductive structure is disposed over the at least one first thermally conductive structure. At least one light-emitting diode (LED) is disposed over the at least one second thermally conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package system comprising:
a substrate having at least three first thermally conductive structures each extending at least partially through the substrate;
at least three second thermally conductive structures each being disposed over, and thermally coupled to, a respective one of the at least three first thermally conductive structures; and
at least one light-emitting diode (LED) disposed over and thermally coupled to the at least three first and second thermally conductive structures, wherein the at least one LED includes a P-type layer and an N-type layer, the P-type layer being thermally coupled to a first subset of the at least three first and the at least three second thermally conductive structures, the N-type layer being thermally coupled to a second subset of the at least three first and at least three second thermally conductive structures, wherein at least one of the first subset and the second subset includes a number that is greater than one.

2. The package system of claim 1, wherein the substrate has a cavity for accommodating the at least one LED.

3. The package system of claim 2, where the at least one LED includes a transparent substrate and a surface of the transparent substrate is substantially level with a surface of the substrate.

4. The package system of claim 3 further comprising a lens material disposed between the substrate and the at least one LED, wherein a surface of the lens material is substantially level with the surface of the transparent substrate.

5. The package system of claim 2, wherein the at least one LED includes a transparent substrate and a surface of the transparent surface is lower than a surface of the substrate.

6. The package system of claim 5 further comprising a lens material disposed between the substrate and the at least one LED, wherein a surface of the lens material is over the surface of the transparent substrate.

7. The package system of claim 1 further comprising a polymer material around the substrate and extending from a first surface of the substrate to a second surface of the substrate.

8. The package system of claim 1, wherein the at least three first thermally conductive structures each includes a through-silicon-via (TSV) and wherein the at least three second thermally conductive structures each includes a bump structure.

9. The package system of claim 1, wherein the LED is directly coupled to each of the at least three second thermally conductive structures.

10. A package system comprising:
a first substrate having at least one through-silicon-vias (TSVs) through the first substrate;
at least one bump structure disposed over the at least one TSV;
at least one light-emitting diode (LED) disposed over the at least one bump structure, wherein the first substrate has a cavity for accommodating the LED, wherein the LED includes a transparent second substrate having a surface that is substantially level with a surface of the first substrate; and
a lens material disposed between the first substrate and the LED, wherein a surface of the lens material is substantially level with the surface of the transparent second substrate.

11. The package system of claim 10, wherein the cavity has a flat surface and at least one beveled surface and the flat surface and the at least one beveled surface form an angle between about 50° and about 60°.

12. The package system of claim 10 further comprising a polymer material around the substrate and extending from a first surface of the substrate to a second surface of the substrate.

13. A package system comprising:
a substrate having a cavity with a flat surface and at least one beveled surface;
three or more elongate thermally conductive components extending through the substrate;
a light-emitting diode (LED) disposed within the cavity and being thermal conductively coupled to the three or more elongate thermally conductive components, wherein the LED includes a transparent substrate;
a lens material disposed between the LED and the substrate; and
a polymer material disposed around the substrate and extending from a first surface of the substrate to a second surface of the substrate.

14. The package system of claim 13, wherein a surface of the transparent surface and a surface of the lens material are substantially level with the first surface of the substrate.

15. The package system of claim 13, wherein a surface of the transparent surface is lower than the first surface of the substrate and a surface of the lens material is over the surface of the transparent substrate.

16. The package system of claim 10, wherein the plurality of TSVs exceeds two.

17. The package system of claim 16, wherein each of the LEDs is thermally coupled to at least three of the plurality of TSVs.

18. The package system of claim 17, wherein each of the LEDs includes a P-type semiconductor layer and an N-type semiconductor layer, the P-type semiconductor layer being thermally and electrically coupled to a first group of the plurality of TSVs, and the N-type semiconductor layer being thermally and electrically coupled to a second group of the plurality of TSVs, wherein at least one of the first and second groups includes at least two TSVs.

19. The package system of claim 10, wherein a portion of the cavity includes a reflective surface.

* * * * *